United States Patent
Tabrizian (10) Patent No.: US 11,799,448 B2
(45) Date of Patent: Oct. 24, 2023

(54) DIGITALLY TUNABLE ACOUSTIC WAVE RESONATORS

(71) Applicant: University of Florida Research Foundation, Incorporated, Gainesville, FL (US)

(72) Inventor: Roozbeh Tabrizian, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 406 days.

(21) Appl. No.: 17/173,919

(22) Filed: Feb. 11, 2021

(65) Prior Publication Data

US 2021/0257987 A1     Aug. 19, 2021

Related U.S. Application Data

(60) Provisional application No. 62/976,372, filed on Feb. 14, 2020.

(51) Int. Cl.
*H03H 9/17* (2006.01)
*H03H 3/02* (2006.01)
*H03H 9/02* (2006.01)
*H03H 9/13* (2006.01)

(52) U.S. Cl.
CPC .............. *H03H 9/176* (2013.01); *H03H 3/02* (2013.01); *H03H 9/02031* (2013.01); *H03H 9/13* (2013.01); *H03H 9/175* (2013.01); *H03H 2003/025* (2013.01); *H03H 2009/02196* (2013.01)

(58) Field of Classification Search
CPC .... H03H 9/176; H03H 9/02031; H03H 9/175; H03H 9/13
See application file for complete search history.

(56) References Cited

U.S. PATENT DOCUMENTS

| | | | |
|---|---|---|---|
| 2009/0059464 A1* | 3/2009 | McKinzie, III | H01G 7/06 361/281 |
| 2012/0056694 A1* | 3/2012 | Pang | H03H 9/02149 333/187 |
| 2014/0132117 A1* | 5/2014 | Larson, III | H03H 9/175 204/192.1 |
| 2017/0331457 A1* | 11/2017 | Satoh | H10N 30/40 |
| 2019/0199324 A1* | 6/2019 | Matsumoto | H03H 9/0547 |
| 2019/0326880 A1* | 10/2019 | Figueredo | H03H 9/173 |

OTHER PUBLICATIONS

Used Global Dossier to search for U.S. Appl. No. 17/173,919. (Year: 2023).*

* cited by examiner

*Primary Examiner* — Bryan P Gordon
(74) *Attorney, Agent, or Firm* — ALSTON & BIRD LLP (57) ABSTRACT

A digitally tunable acoustic wave resonator includes, in part, a first electrode positioned above a substrate, a composite stack positioned above the first electrode, and a second electrode positioned above the composite stack. The composite stack may include one or more alternate layers of a ferroelectric layer and a transition-metal nitride layer. The transition-metal nitride layer can be positioned above the ferroelectric layer, except the ferroelectric layer at the top of the composite stack. The ferroelectric layer comprises an aluminum scandium nitride layer $Al_{1-x}Sc_xN$, where $0<x<1$.

20 Claims, 7 Drawing Sheets

Figure 7

DIGITALLY TUNABLE ACOUSTIC WAVE RESONATORS

CROSS-REFERENCE TO RELATED APPLICATIONS

This patent application claims priority to Provisional Application Ser. No. 62/976,372, filed Feb. 14, 2020, which is incorporated herein by reference in its entirety.

TECHNICAL FIELD

The present application relates generally to the field of resonators, and more specifically, to a digitally tunable acoustic wave resonator.

BACKGROUND

Ever increasing desire to reduce cost and size of electronic equipment has led to a continuing need for smaller resonators. Consumer electronics such as cellular telephones and miniature radios place severe limitations on both the size and cost of the components contained therein. Many such devices utilize resonators that must be tuned to precise frequencies. Although various materials with different characteristics have been used in fabricating resonators, there is a need to resonators with higher configurability and tunability.

BRIEF SUMMARY

Disclosed is a digitally tunable acoustic wave resonator. In some embodiments, the digitally tunable acoustic wave resonator comprises a substrate, a first electrode, a composite stack, and a second electrode. In some embodiments, the first electrode is positioned above the substrate. The substrate may comprise a silicon layer. In some embodiments, the substrate comprises a Bragg mirror on single crystal silicon layer. The first electrode may comprise a Molybdenum (Mo) layer. The first electrode may act as a bottom electrode.

In some embodiments, the composite stack is positioned above the first electrode. The composite stack comprises one or more alternate layers of a ferroelectric layer and a transition-metal nitride layer. In some embodiments, the transition-metal nitride layer is positioned above a corresponding ferroelectric layer except the ferroelectric layer at the top of the composite stack. In some embodiments, the ferroelectric layer comprises an aluminum scandium nitride layer ($Al_{1-x}Sc_xN$), in which 0<x<1. The $Al_{1-x}Sc_xN$ becomes ferroelectric when scandium content exceeds 27%. In some embodiments, the ferroelectric layer comprises aluminum-scandium-nitride films ($Al_{1-x}Sc_xN$) where x is at least 0.27. In some embodiments, the ferroelectric layer comprises aluminum-scandium-nitride films ($Al_{1-x}Sc_xN$) where 0.27<x<0/3. In some embodiments, the ferroelectric layer has a thickness of about 20 nanometers to about 100 nanometers. In some embodiments, the transition-metal nitride includes titanium nitride. Alternatively, in some embodiments, the transition-metal nitride includes tantalum nitride. Further, in some embodiments, the transition-metal nitride layer has a thickness of about 5 nanometers to about 20 nanometers. In some embodiments, a number of aluminum scandium nitride/transition-metal nitride layers are so alternatively stacked on each other that the composite stack has a thickness of about 500 nanometers to about 1000 nanometers. In some embodiments, the second electrode is positioned above the composite stack. The second electrode may comprise a Molybdenum (Mo) layer. The second electrode may act as a top electrode.

In some embodiments, the transition-metal in the transition-metal nitride is so chosen that the transition-metal nitride possesses a large coefficient of thermal expansion. Therefore, a breaking of structural homogeneity of the aluminum scandium nitride layers through disruptive layering by depositing the transition-metal nitride layers, along with the large coefficient of thermal expansion of transition-metal nitrides enables stress-mediation of the aluminum scandium nitride layers. In some embodiments, the stress-mediation of the aluminum scandium nitride layers is further enhanced through a rapid thermal annealing (RTA) method with low thermal budget within post-CMOS integration allowance. In some embodiments, the digitally tunable acoustic wave resonator relies on the use of in-situ ovenization through passing a DC current across the transition-metal nitride layers to enable polarization switching of the aluminum scandium nitride layers with significantly lower voltages.

BRIEF DESCRIPTION OF THE DRAWINGS

So that the present disclosure can be understood by those of ordinary skill in the art, a more detailed description can be had by reference to aspects of some illustrative embodiments, some of which are shown in the accompanying drawings.

In accordance with common practice some features illustrated in the drawings cannot be drawn to scale. Accordingly, the dimensions of some features can be arbitrarily expanded or reduced for clarity. In addition, some of the drawings cannot depict all the components of a given system, method or device. Finally, like reference numerals can be used to denote like features throughout the specification and figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Disclosed herein is a digitally tunable acoustic wave resonator through the use of ferroelectric switching in scandium-doped aluminum nitride ($Sc_xAl_{1-x}N$) films.

It will also be understood that, although the terms first, second, and/or the like are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to comprise the plural forms as well, unless the context clearly indicates otherwise. It will also be understood that the term "and/or" as used herein refers to and encompasses any and all possible combinations of one or more of the associated listed items. It will be further understood that the terms "comprises," "comprising," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

It should be appreciated that in the development of any actual implementation (as in any development project), numerous decisions must be made to achieve the developers' specific goals (e.g., compliance with system and business-related constraints), and that these goals will vary from one implementation to another. It will also be appreciated that such development efforts might be complex and time consuming but would nevertheless be a routine undertaking for those of ordinary skill in the art of image capture having the benefit of this disclosure.

While evidence of ferroelectric characteristic in aluminum scandium nitride ($Sc_xAl_{1-x}N$) films is recently observed, practical use of the ferroelectric characteristics for implementation of novel devices is hindered by a large coercive field in aluminum scandium nitride films. This coercive field prevents polarization switching with available voltages on semiconductor chips. Even though increasing scandium content reduces the coercive field, it promotes formation of undesirable crystal morphologies, e.g., cubic morphologies. The coercive fields further make reactive ion etching (RIE) excessively challenging, and increase electromechanical energy dissipation. Disclosed is a digitally tunable acoustic resonator which operates based on stress engineering of the aluminum scandium nitride film through stacking with thin transition-metal nitride layers. To that end, a post-deposition treatment is used to tailor the aluminum scandium nitride crystal morphology and ferroelectric properties. The post-deposition treatment is performed through in-situ low-thermal-budget annealing. Resulting layered ferroelectric aluminum scandium nitride transducer enables realization of intrinsically tunable/configurable acoustic wave resonators with wide spectral coverage.

Figure 1:
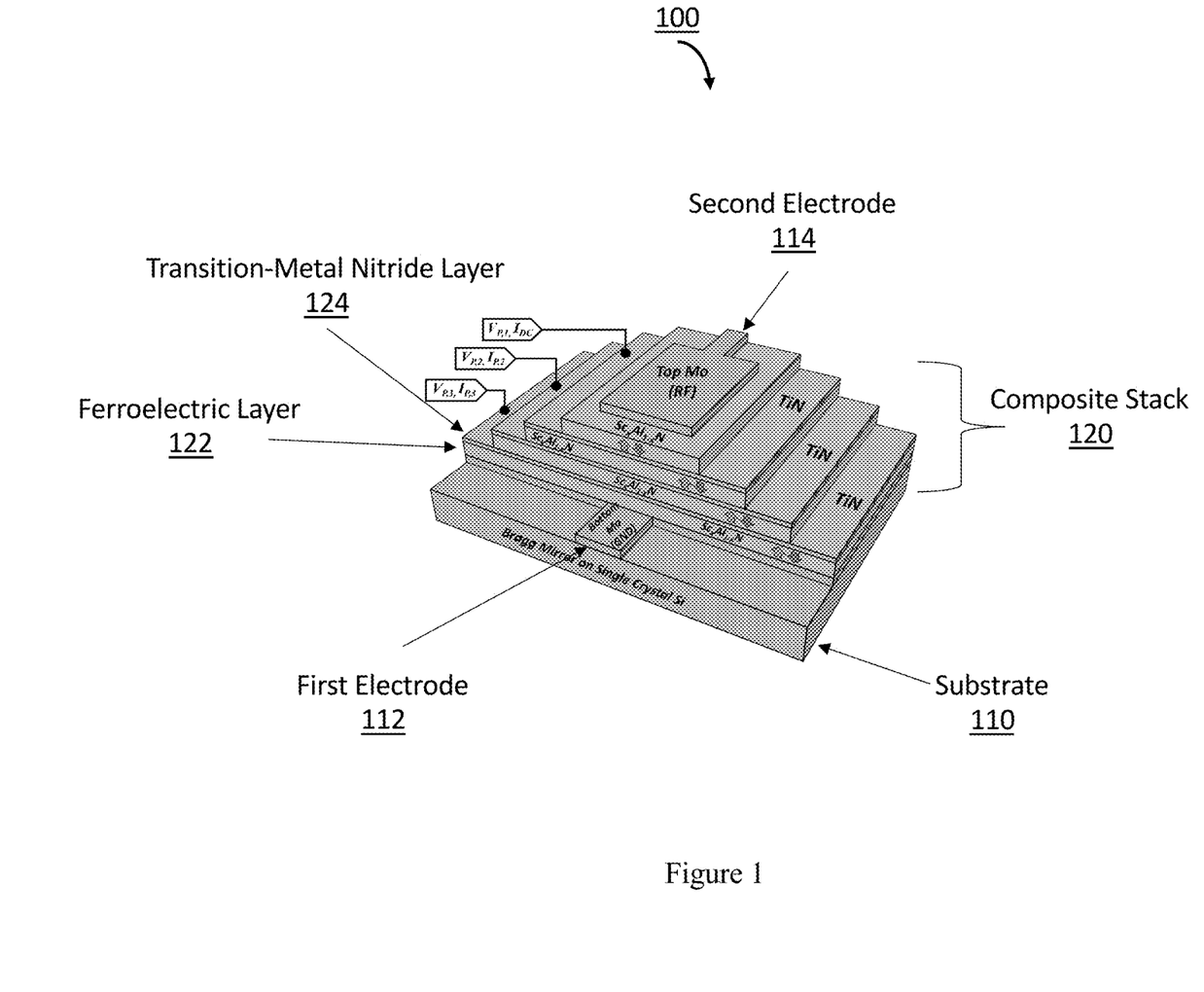
FIG. 1 illustrates a block diagram of an exemplary digitally tunable acoustic wave resonator, in accordance with some embodiments.

FIG. 1 illustrates a block diagram of an exemplary digitally tunable acoustic wave resonator 100, in accordance with some embodiments. As shown, the digitally tunable acoustic wave resonator 100 comprises a substrate 110, a first electrode 112, a composite stack 120, and a second electrode 114. In some embodiments, the first electrode 112 is positioned above the substrate 110. The substrate 110 may be a silicon layer. In some embodiments, the substrate 110 comprises a Bragg mirror on single crystal silicon layer. The first electrode 112 may comprise a Molybdenum (Mo) layer. The first electrode 112 may act as a bottom electrode.

In some embodiments, the composite stack 120 is positioned over the first electrode 112. The composite stack includes one or more alternate layers of a ferroelectric layer 122 and a transition-metal nitride layer 124. In some embodiments, the transition-metal nitride layer 124 is positioned above a corresponding ferroelectric layer 122. In some embodiments, there is no transition-metal nitride layer above the ferroelectric layer at the top of the composite stack. In some embodiments, the ferroelectric layer 122 comprises an aluminum scandium nitride layer ($Al_{1-x}Sc_xN$), in which 0<x<1. The $Al_{1-x}Sc_xN$ becomes ferroelectric when Sc-content (e.g., x) exceeds 27%. In some embodiments, the ferroelectric layer 122 comprises aluminum-scandium-nitride films $Al_{1-x}Sc_xN$ where x is at least 0.27. In some embodiments, the ferroelectric layer 122 has a thickness of about 20 nanometers to about 100 nanometers. In some embodiments, the transition-metal nitride comprises titanium nitride. Alternatively, in some embodiments, the transition-metal nitride comprises tantalum nitride. Further, in some embodiments, the transition-metal nitride layer has a thickness of about 5 nanometers to about 20 nanometers. In some embodiments, a number of alternatively stacked aluminum scandium nitride/transition-metal nitride layers so changes that the composite stack has a thickness of about 500 nanometers to about 1000 nanometers.

In some embodiments, the transition-metal in the transition-metal nitride is so chosen that the transition-metal nitride possesses a large coefficient of thermal expansion. Therefore, a breaking of structural homogeneity of the aluminum scandium nitride layers through disruptive layering by depositing the transition-metal nitride layers, along with the large coefficient of thermal expansion of transition-metal nitrides enables stress-mediation of the aluminum scandium nitride layers. In some embodiments, the stress-mediation of the aluminum scandium nitride layers is performed through a rapid thermal annealing (RTA) method with low thermal budget within post-CMOS integration allowance. The RTA is a process used in the semiconductor industry, which consists of heating a single wafer at a time in order to affect its electrical properties. In some embodiments, one or more heat treatments are designed for different effects. In some embodiments, the wafers are heated in order to at least one of: activate dopants, change film-to-film or film-to-substrate interfaces, densify deposited films, change states of grown films, repair damage from ion implantation, move dopants or drive dopants from one film into another or from a film into the wafer substrate. In some embodiments, the RTA is performed by equipment that heats a single wafer at a time using either lamp based heating, a hot chuck, or a hot plate that a wafer is brought near.

In some embodiments, the second electrode 114 is positioned above the composite stack 120. The second electrode may comprise a Molybdenum (Mo) layer. The second electrode 114 may act as a top electrode.

Figure 2:
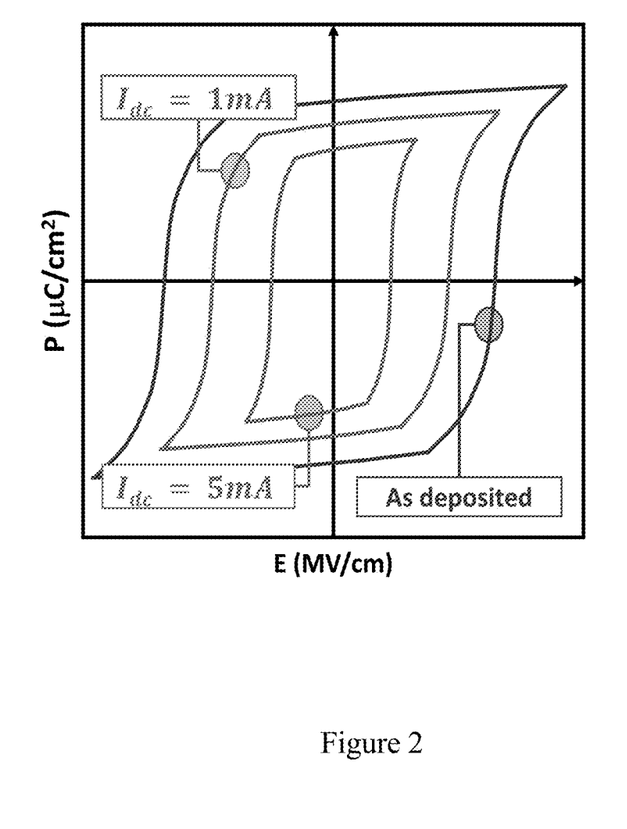
FIG. 2 illustrates ferroelectric hysteresis loops for a composite stack, in accordance with some embodiments.

FIG. 2 illustrates ferroelectric hysteresis loops for a composite stack, in accordance with some embodiments. The composite stack includes one or more alternate layers of the ferroelectric layer 122 and the transition-metal nitride layer 124. The hysteresis loops of the composite stack correspond to different ovenization currents. A conductive nature of the transition-metal nitride layers enables in-situ Joule heating through passing a DC current. The conductive nature of the transition-metal layers further facilitates localized alleviation of ferroelectric polarization switching at device level. Additionally, independent access to each of the aluminum scandium nitride layer in the stack enables polarization switching of each aluminum scandium nitride layer with low voltage and in parallel, i.e., several layers at once. As an example, one or more of the aluminum scandium nitride layers can be electrically accessed with a voltage of about less than 10V. In some embodiments, utilizing low voltages reduces a switching time.

Figure 3:
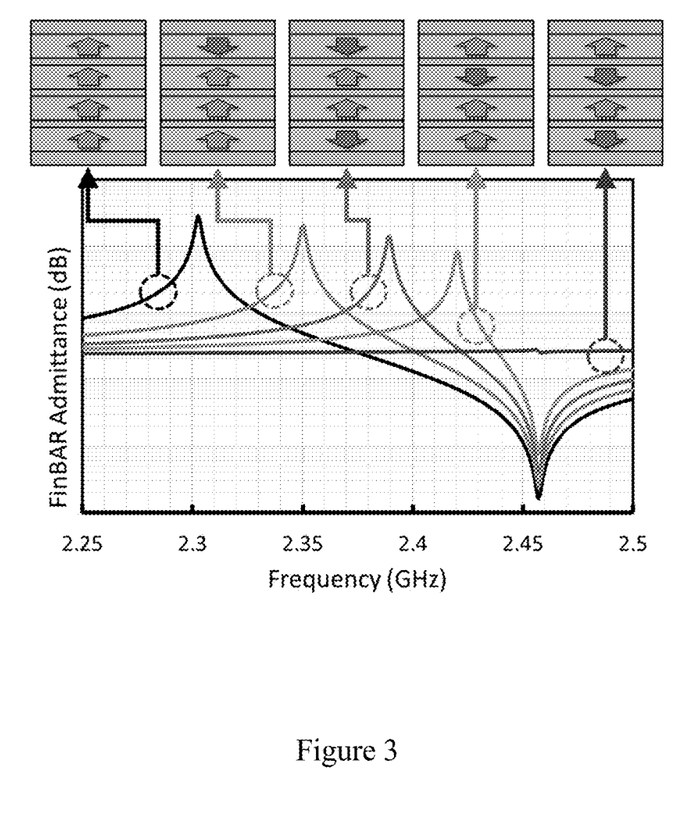
FIG. 3 illustrates a simulated admittance of a digitally tunable acoustic wave resonator, in accordance with some embodiments.

FIG. 3 illustrates a simulated admittance of a digitally tunable acoustic wave resonator, in accordance with some embodiments. In some embodiments, the independent access to the polarization of the aluminum scandium nitride layers enables digital tuning of an effective acoustic wave velocity and an electromechanical transduction of the composite stack. FIG. 3 shows a simulated admittance of a solidly mounted fin bulk acoustic wave resonator for different polarization scenarios. A transducer of the solidly mounted fin bulk acoustic wave resonator is composed of one or more aluminum scandium nitride layers, with x=0.34, i.e., $Sc_{0.34}Al_{0.66}N$, and one or more titanium nitride layers. Each aluminum scandium nitride layer has a thickness of about 100 nanometers, and each titanium nitride layer has a thickness of about 20 nanometers. As shown in FIG. 3, the digital tuning of the composite stack and the electromechanical transduction translate to extended tunability of the frequency and electromechanical coupling, i.e., $k_{eff}^2$. While the use of mechanical stress mediation obviates a need for excessive scandium doping content and associated undesirable consequences, practical use of stressed films for implementation of digitally tunable acoustic wave resonators is hindered by reliability of device fabrication and robustness of operation, which includes unpredictable behavior of the stressed composite stack during and after release. The unpredictable behavior of the stressed composite stack during and after release may result in two scenarios: either cracking of the composite stack, or compensation of the mechanical stress that nulls the stress mediation needed for ferroelectric behavior. The digitally tunable acoustic wave resonators disclosed herein demonstrate an intrinsically configurable behavior which is created from ferroelectric polarization switching in aluminum scandium nitride layers.

Figure 4:
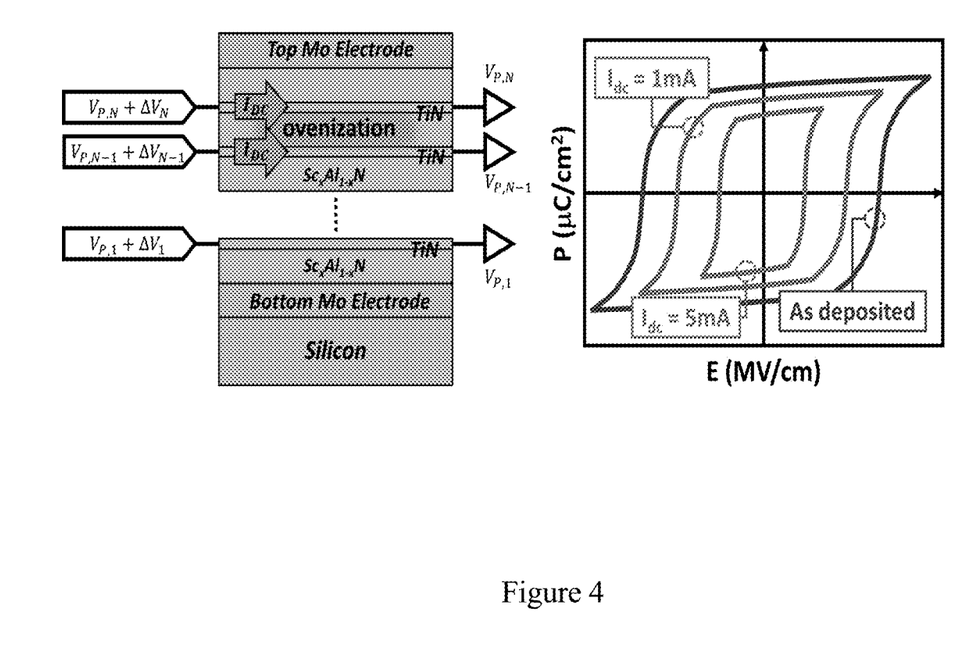
FIG. 4 illustrates tuning of a hysteresis loop for a composite stack, in accordance with some embodiments.

FIG. 4 illustrates tuning of a hysteresis loop for a composite stack, in accordance with some embodiments. The digitally tunable acoustic wave resonator relies on the use of in-situ ovenization through passing a DC current across the transition-metal nitride interlayers, to enable polarization switching of the aluminum scandium nitride layers with significantly lower voltages, e.g., less than about 10V. In some embodiments, a transducer configuration scheme is realized based on polarization switching of selective aluminum scandium nitride layers in the composite stack, which enables digital tuning of the electromechanical coupling ($k_{eff}^2$) and acoustic velocity. The digital tuning of the electromechanical coupling and acoustic velocity are basis of the intrinsically configurable resonators. In some embodiments, very large temperature gradients can be achieved, e.g., up to sublimation of the transition-metal nitride, through application of small DC currents. This feature enables polarization switching of the aluminum scandium nitride layers with lower-end of scandium concentration, i.e., 27%<x<30%, without a need for large poling voltages that are not available on a chip.

Figure 5:
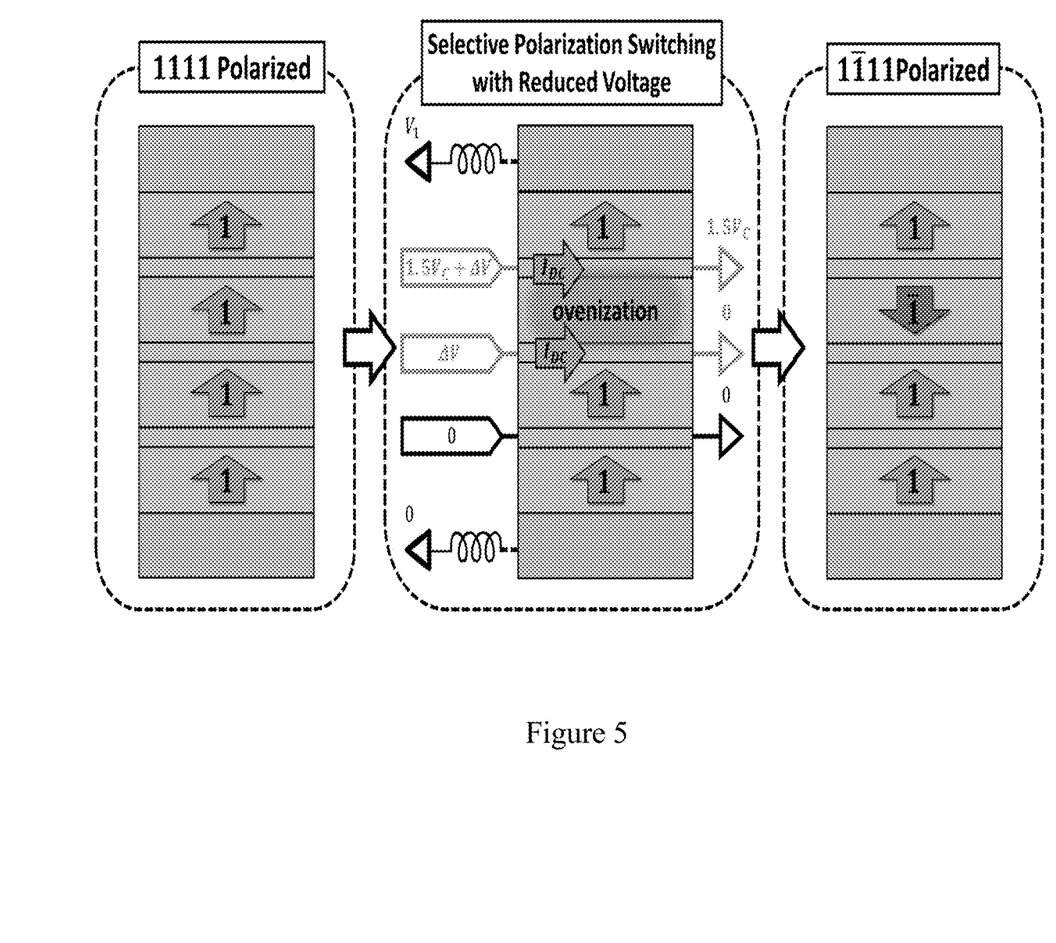
FIG. 5 illustrates an exemplary method of a digital tuning concept, in accordance with some embodiments.

As shown in FIG. 4, the hysteresis P-E loop is configured through the use of in-situ ovenization created from the DC current passing through the transition-metal nitride layers that encapsulate a desirable aluminum scandium nitride layer in the composite stack. The electrical access provided by conductive transition-metal nitride, e.g., the TiN/TaN interlayers, enables independent control on polarization switching and ovenization of individual aluminum scandium nitride layers in the composite stack. In some embodiments, selective polarization switching of the aluminum scandium nitride layers can be interpreted as digital tuning of the transducer electromechanical properties, i.e., digital tuning of $k_{eff}^2$ and acoustic velocity. FIG. 5 illustrates an exemplary method of a digital transducer tuning, in accordance with some embodiments. In some embodiments, the polarization of a single aluminum scandium nitride layer in the composite stack is switched during the in-situ ovenization with proper voltage.

Figure 6:
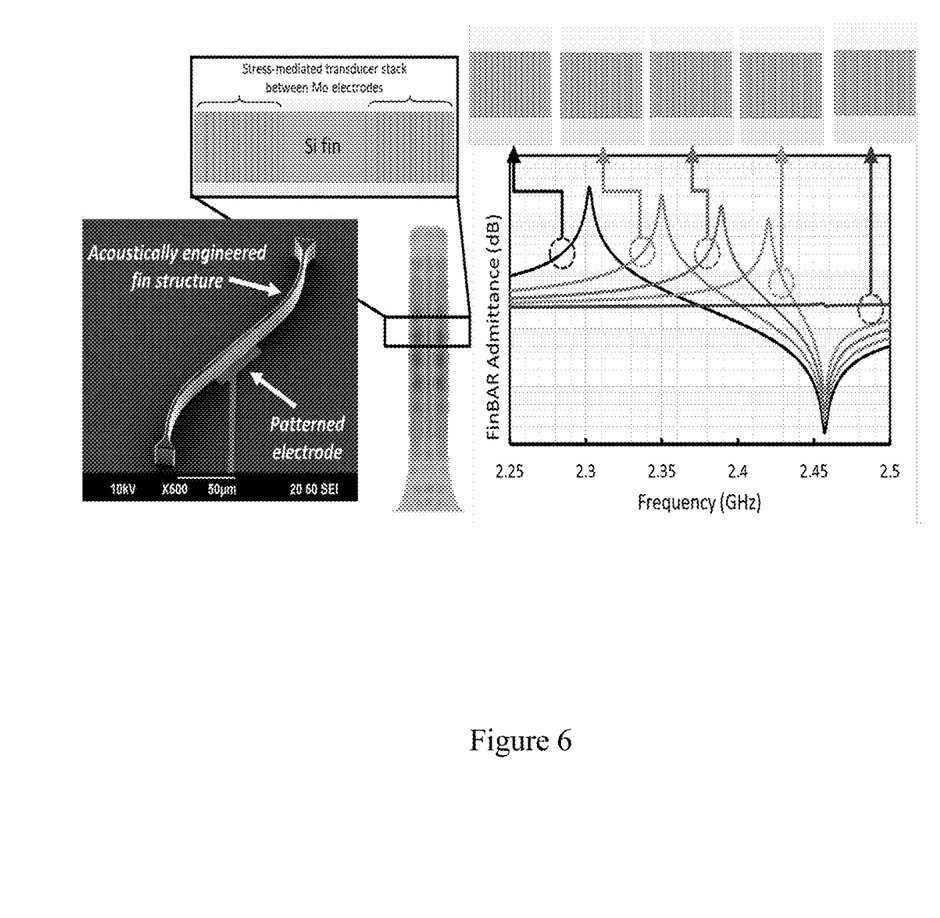
FIG. 6 shows an exemplary digitally tunable acoustic wave resonator, in accordance with some embodiments.

FIG. 6 shows an exemplary digitally tunable acoustic wave resonator, in accordance with some embodiments. A fin bulk acoustic resonator, i.e., a FinBAR, is shown, in which the tunable acoustic wave resonator is used to enable the tuning. Simulation shows selective polarization switching of the aluminum scandium nitride layers in the composite stack configures the admittance of the FinBAR, resulting in large frequency and $k_t^2$ (effective electromechanical coupling) change. The inset image is a scanning electron microscopy (SEM) image showing a proof-of-concept FinBAR.

Figure 7:
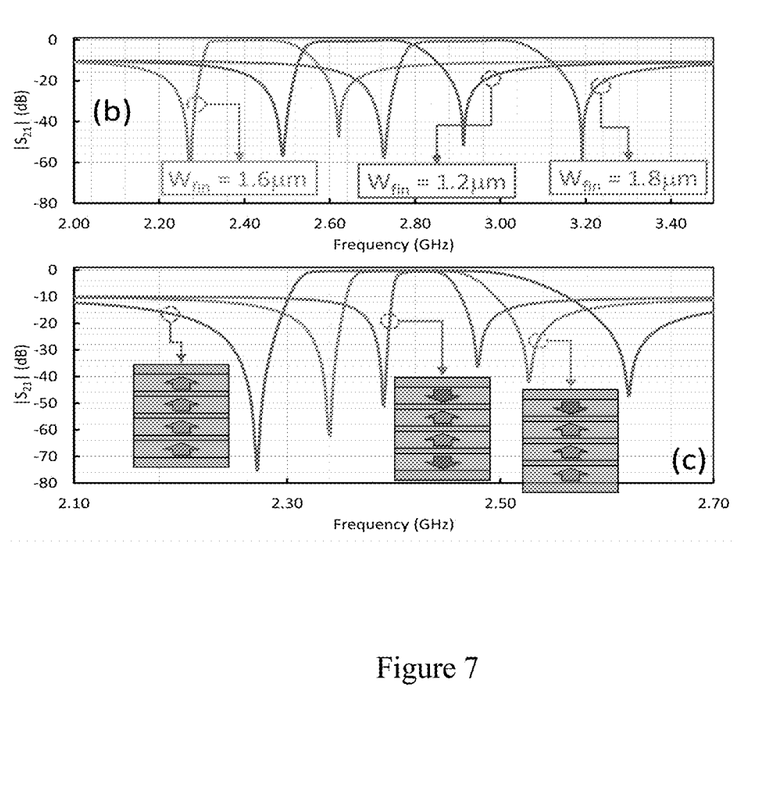
FIG. 7 shows a simulated transmission response of filters created from electrical coupling of ferroelectrically transduced configurable FinBARs shown in FIG. 6.

FIG. 7 shows a simulated transmission response of filters created from electrical coupling of ferroelectrically transduced configurable FinBARs shown in FIG. 6. In some embodiments, large frequency and bandwidth reconfiguration is achieved through tuning the ferroelectric transducers of constituent FinBARs.

In some embodiments, the digitally tunable acoustic wave resonator is used in multi-band 5G radios and tactical communication systems.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A digitally tunable acoustic wave resonator comprising:
 a first electrode positioned above a substrate;
 a composite stack positioned above the first electrode, the composite stack comprising a plurality of alternate layers of a ferroelectric layer and a transition-metal nitride layer; and
 a second electrode positioned above the composite stack, wherein the ferroelectric layer comprises an aluminum scandium nitride layer ($Al_{1-x}Sc_xN$), and wherein $0<x<1$.

2. The digitally tunable acoustic wave resonator of claim 1, wherein the transition-metal nitride layer comprises a Titanium nitride layer (TiN).

3. The digitally tunable acoustic wave resonator of claim 1, wherein the transition-metal nitride layer comprises a Tantalum nitride layer (TaN).

4. The digitally tunable acoustic wave resonator of claim 1, wherein the first electrode and the second electrode comprise Molybdenum (Mo).

5. The digitally tunable acoustic wave resonator of claim 1, wherein the substrate comprises a Bragg mirror on single crystal silicon.

6. The digitally tunable acoustic wave resonator of claim 1, wherein the substrate comprises silicon.

7. The digitally tunable acoustic wave resonator of claim 1, wherein the ferroelectric layer has a thickness of about 20 nanometers to about 100 nanometers.

8. The digitally tunable acoustic wave resonator of claim 1, wherein the transition-metal nitride layer has a thickness of about 5 nanometers to about 20 nanometers.

9. The digitally tunable acoustic wave resonator of claim 1, wherein the composite stack has a thickness of about 500 nanometers to about 1000 nanometers.

10. The digitally tunable acoustic wave resonator of claim 1, wherein the transition-metal nitride layer is positioned above a corresponding ferroelectric layer except the topmost ferroelectric layer in the composite stack.

11. The digitally tunable acoustic wave resonator of claim 1, wherein $0.27<x<0.3$.

12. A method of fabricating a digitally tunable acoustic wave resonator, comprising:
    forming a first electrode above a substrate;
    forming a composite stack above the first electrode, the composite stack comprising a plurality of alternate layers of a ferroelectric layer and a transition-metal nitride layer; and
    forming a second electrode above the composite stack,
    wherein the ferroelectric layer comprises an aluminum scandium nitride layer ($Al_{1-x}Sc_xN$), and wherein $0<x<1$.

13. The method of claim 12, wherein the transition-metal nitride layer comprises a Titanium nitride layer (TiN).

14. The method of claim 12, wherein the transition-metal nitride layer comprises a Tantalum nitride layer (TaN).

15. The method of claim 12, wherein the first electrode and the second electrode comprise Molybdenum (Mo).

16. The method of claim 12, wherein the substrate comprises a Bragg mirror on single crystal silicon.

17. The method of claim 12, wherein $0.27<x<0.3$.

18. The method of claim 12, wherein the ferroelectric layer has a thickness of about 20 nanometers to about 100 nanometers.

19. The method of claim 12, wherein the transition-metal nitride layer has a thickness of about 5 nanometers to about 20 nanometers.

20. The method of claim 12, wherein the transition-metal nitride layer is positioned above a corresponding ferroelectric layer except the topmost ferroelectric layer in the composite stack.

\* \* \* \* \*